United States Patent
Sundt et al.

(10) Patent No.: US 6,727,158 B2
(45) Date of Patent: Apr. 27, 2004

(54) STRUCTURE AND METHOD FOR FORMING A FACETED OPENING AND A LAYER FILLING THEREIN

(75) Inventors: Dirk J. Sundt, Boise, ID (US); William A. Polinsky, Boise, ID (US); Mark A. Bossler, Meridian, ID (US); Gabriel G. Videla, Kuna, ID (US); Chris L. Inman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/007,295

(22) Filed: Nov. 8, 2001

(65) Prior Publication Data

US 2003/0085444 A1 May 8, 2003

(51) Int. Cl.[7] .............................................. H01L 21/76
(52) U.S. Cl. ...................... 438/424; 438/424; 438/445; 438/692; 438/694; 438/695; 438/696; 438/697; 438/510; 438/506; 438/701; 438/713; 438/736
(58) Field of Search .................... 438/424, 692, 438/694, 695, 696, 697, 700, 445, 701, 713, 736, 739, 740; 257/510, 506, 640, 646

(56) References Cited

U.S. PATENT DOCUMENTS

| 4,639,288 A | * | 1/1987 | Price et al. | 156/643 |
| 6,159,823 A | * | 12/2000 | Song et al. | 438/437 |
| 6,177,331 B1 | * | 1/2001 | Koga | 438/424 |
| 6,372,602 B1 | * | 4/2002 | Mitsuiki | 438/424 |
| 6,548,371 B2 | * | 4/2003 | Fujimaki | 438/424 |

OTHER PUBLICATIONS

Scott Clark, "Chemical Etching of Silicon Nitride (Si3N4) with Hot Phosphoric Acid (H3PO4)," Bold Technologies Technical Paper (2000), pp. 1–6.*
Nathan Cheung, Lecture notes (handout) EE 143, Lecture 15, University of California Berkeley (2000).*

* cited by examiner

*Primary Examiner*—Steven Loke
*Assistant Examiner*—Thomas Magee
(74) *Attorney, Agent, or Firm*—Dorsey & Whitney LLP (57) ABSTRACT

Structure and method for filling an opening in a semiconductor structure that is less susceptible to the formation of voids. A first layer of a first material is formed over the layer in which the opening is to be formed, and a faceted opening is formed in the first layer. The opening in the underlying layer is subsequently formed, and the material that is to fill the opening is deposited over the faceted opening and into the opening of the underlying layer.

21 Claims, 8 Drawing Sheets

STRUCTURE AND METHOD FOR FORMING A FACETED OPENING AND A LAYER FILLING THEREIN

TECHNICAL FIELD

The invention relates generally to semiconductor devices, and more particularly to a structure and method for forming a trench, contact hole, or via, and subsequently depositing a material therein, that is less susceptible to the formation of voids.

BACKGROUND OF THE INVENTION

One type of structure that is commonly found in semiconductor devices is an isolation region, which is used to isolate or prevent current flow between adjacent active regions formed in a semiconductor substrate. Active regions are generally doped regions implanted in a substrate. For example, source/drain regions of a transistor can be considered active regions. An isolation region is formed between the source/drain regions of adjacent transistors to prevent current from flowing from one transistor to the other. This type of isolation region can be found in many conventional memory devices.

One method of forming isolation regions uses a process of the local oxidation of silicon (LOCOS). Typically, a nitride layer is formed on a substrate and subsequently patterned and etched to expose portions of the substrate surface where the isolation regions are to be formed. Thermal oxide is then grown in the exposed areas to form oxide isolation regions. The nitride layer is then removed, and the substrate is ready for device formation in the areas defined by the isolating regions of oxide. This process is well known and will not be described in any greater detail herein. It is enough to note that a shortcoming associated with the LOCOS process is the formation of "bird's beak" spurs that consume lateral area on the surface of a substrate. However, where high density integration of the active regions is desired, sacrificing surface area to accommodate the bird's beak spurs of an isolation region is unacceptable.

An alternative process that does not have the problems associated with LOCOS isolation regions is forming trench-type isolation regions. In this process, rather than performing local oxidation, a trench is formed, and insulating material is deposited therein to form the isolation region. As a result of forming the isolation region by depositing the insulating material into a trench, rather than growing a thermal oxide, the lateral dimensions of the isolation region can be controlled to a much greater degree. Moreover, the formation of bird's beak spurs is no longer an issue since the profile of the trench determines the profile of the isolation region. The conventional process for forming a shallow trench isolation region is generally illustrated by FIG. 1.

Figure 1A:
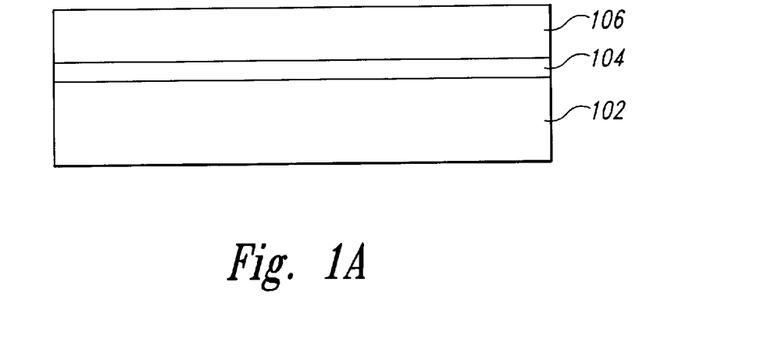
FIGS. 1a–1e are cross-sectional views of an isolation region at various stages of a conventional process.
Figure 1B:
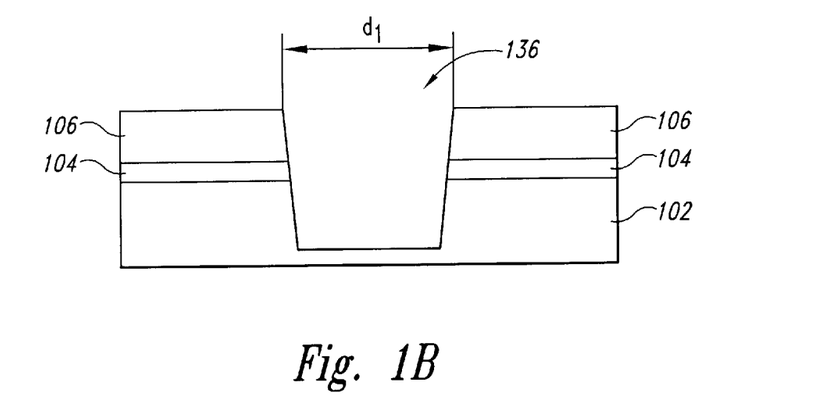
Figure 1C:
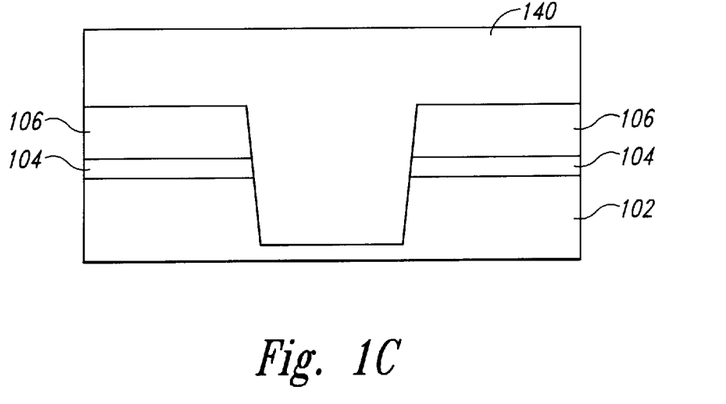
Figure 1D:
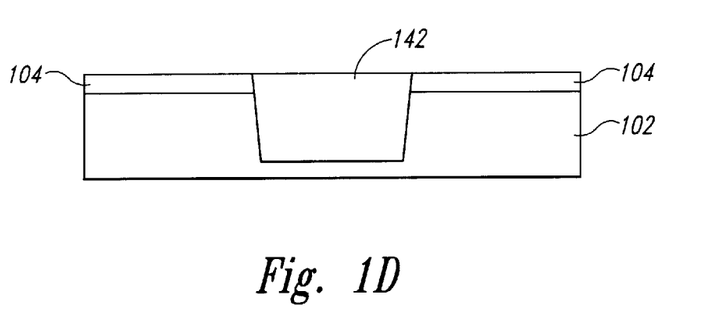

The process begins with masking and etching a trench 136 through a silicon nitride layer 106, a pad oxide layer 104, and into a substrate 102 (FIGS. 1a and 1b). As illustrated in FIG. 1b, the opening of the trench 136 has a dimension $d_1$. An layer of insulating material 140 is formed in the trench and over the silicon nitride layer 106 (FIG. 1c). An etch process is then performed to etch back the layer of insulating material 140 and the silicon nitride layer 106, leaving the pad oxide layer 104 and an isolation region 142 (FIG. 1d). The pad oxide layer 104 is then removed.

Figure 1E:
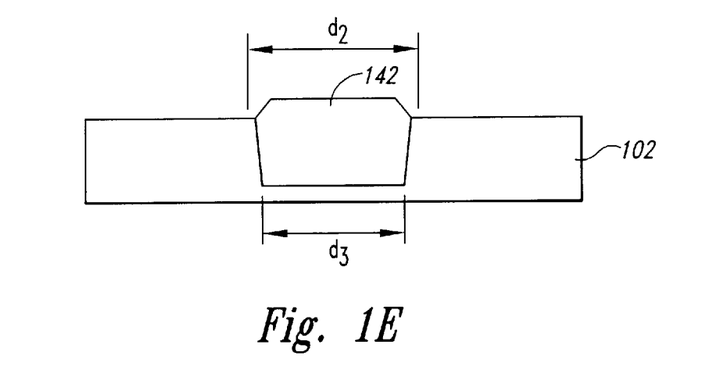

As the dimension $d_1$ is reduced to accommodate the smaller feature sizes of current devices, forming material in the trench 136 becomes more difficult because of step coverage issues. As illustrated in FIG. 1c', a void 150 may be formed in the layer of insulating material 140 because of step coverage effects at the opening of the trench 136. As is acknowledged in the art, the creation of voids during the fabrication of semiconductor devices compromise the structure and ultimately the reliability of the devices. FIGS. 1d' and 1e' illustrate the structure resulting from the conventional process where the void 150 is formed during the formation of the layer of insulating material 140. As previously mentioned, the creation of voids during device fabrication is highly undesirable. Therefore, there is a need for an alternative method for forming an isolation structure that is less susceptible to the formation of voids.

SUMMARY OF THE INVENTION

The present invention is directed to a structure and method for filling an opening in a semiconductor structure that is less susceptible to the formation of voids. A first layer of a first material is formed over the layer in which the opening is to be formed, and a faceted opening is formed in the first layer. The opening in the underlying layer is subsequently formed, and the material that is to fill the opening is deposited over the faceted opening and into the opening of the underlying layer. The faceted opening in the first layer can be formed by performing an isotropic etch on the first layer through an opening in a mask layer that is formed over the first layer.

As is conventional in the field of integrated circuit representation, the lateral sizes and thicknesses of the various layers are not drawn to scale and may have been enlarged or reduced to improve drawing legibility.

DETAILED DESCRIPTION OF THE INVENTION

Embodiments of the present invention provide a structure and method for forming a trench, contact hole, or via, and subsequently depositing a material therein, that is less susceptible to the formation of voids. Certain details are set forth below to provide a sufficient understanding of the invention. However, it will be clear to one skilled in the art that the invention may be practiced without these particular details. In other instances, well-known semiconductor fabrication techniques, processing methods, and materials have not been shown in detail in order to avoid unnecessarily obscuring the invention.

Figure 2:
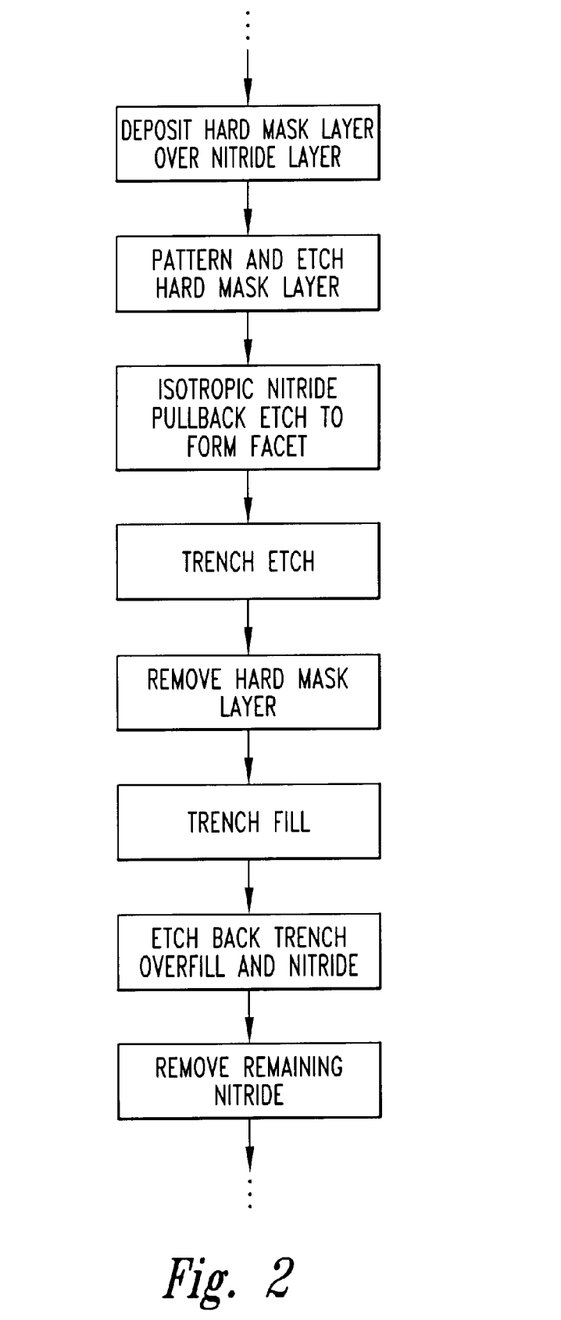
FIG. 2 is a portion of a process flow diagram for the formation of an isolation region according to an embodiment of the present invention.
Figure 3A:
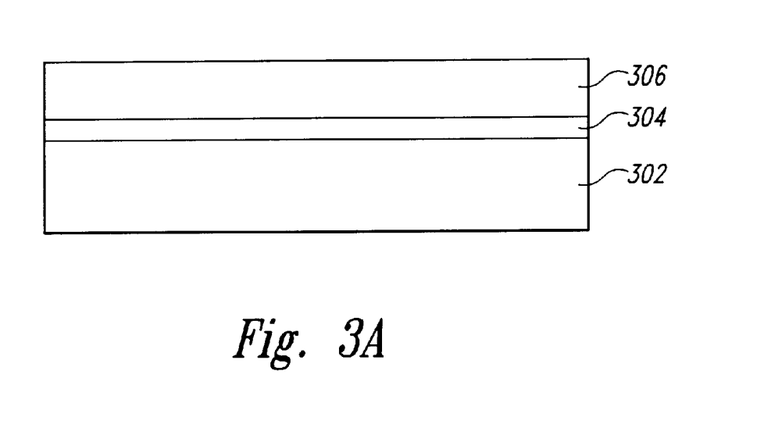
FIGS. 3a–3i are cross-sectional views of an isolation region at various stages according to an embodiment of the present invention.
Figure 3B:
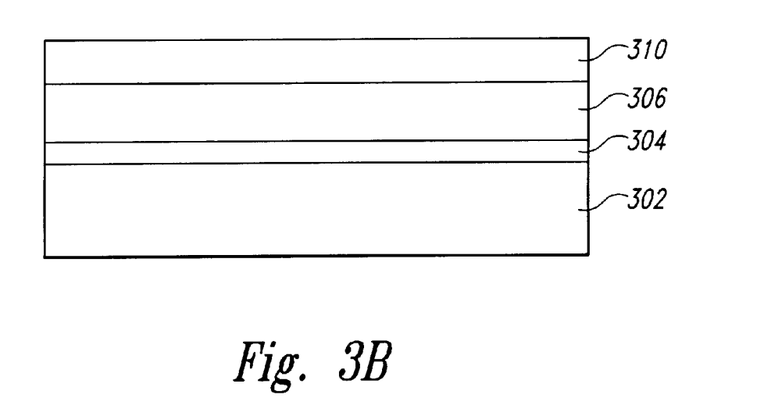

An embodiment of the present invention will be described with respect to the process flow illustrated in FIG. 2, and the cross-sectional diagrams of FIG. 3. The process begins with a structure as illustrated in FIG. 3a having a pad oxide layer 304 formed over a substrate 302. As used herein, the term "substrate" or "semiconductor substrate" will be understood to mean any construction comprising semiconductor material, including but not limited to bulk semiconductive materials, such as a semiconductor wafer, and layers of semiconductive material. Further, the term "substrate" also refers to any supporting structure including, but not limited to, the semiconductive substrates described above. As is understood in the art, the pad oxide layer protects the substrate 302 from damage that may occur from subsequent processing steps. The pad oxide layer 304 further promotes adhesion of a subsequently formed silicon nitride layer 306. Formed on the silicon nitride layer 306 is a hard mask layer 310 (FIG. 3b). As will be explained in more detail below, the hard mask layer 310 can be formed from a silicon oxide layer using conventional fabrication processes.

Figure 3C:
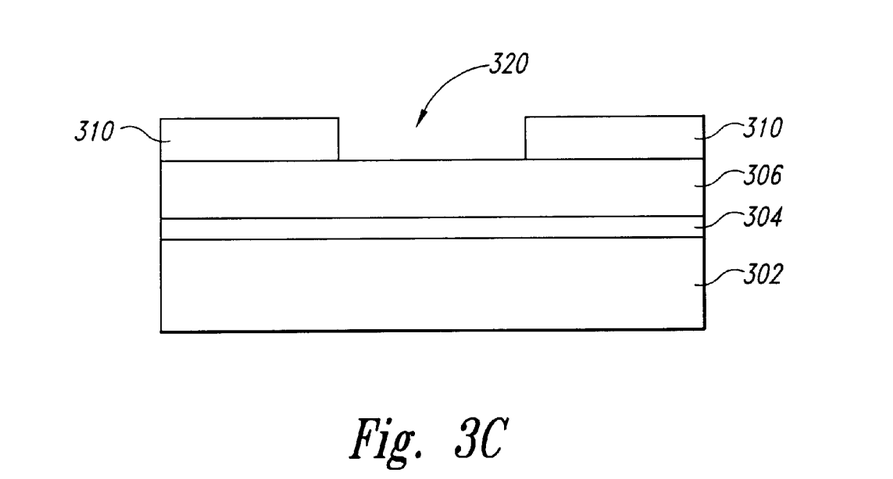

The hard mask layer 310 is masked and subsequently etched to form an opening 320 therethrough to expose a portion of the underlying silicon nitride layer 306 (FIG. 3c). The photomask used in forming the opening 320 can be the same mask used in the conventional process in forming the trench 136 (FIG. 1). Thus, embodiments of the present invention can be implemented without requiring additional masks to be made, and consequently, can be easily integrated into existing process flows.

Figure 3D:
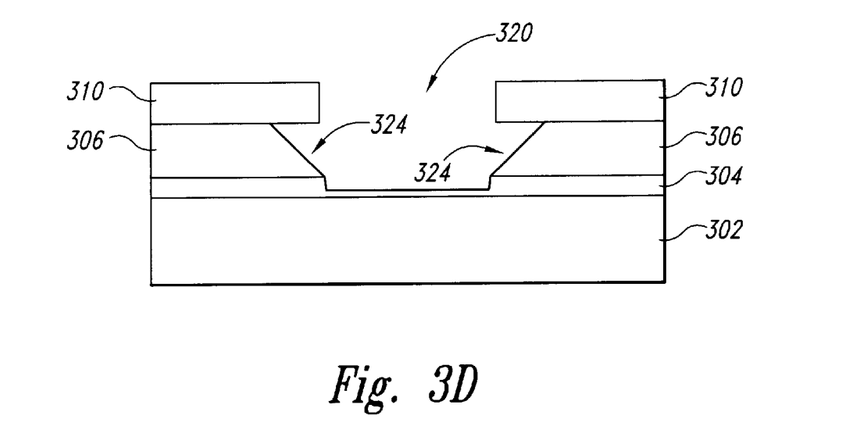

An isotropic "pull-back" etch is performed on the silicon nitride layer 306 to undercut the silicon nitride layer beneath the opening 320 in the hard mask layer 310. As a result, facets 324 are formed (FIG. 3d). The facets 324 are formed because the top portion of the silicon nitride layer 306 near the hard mask layer 310 is etched for the entire time it takes to reach the bottom of the silicon nitride layer 306 near the pad oxide layer 304. It will be appreciated that the material from which the hard mask layer 310 is formed should be relatively resistant to the pull-back etch process. As mentioned previously, a suitable material for the hard mask layer 310 is a silicon oxide material. Moreover, the thickness of the hard mask layer 310 should be selected such that if incidental etching occurs, the remaining thickness of the hard mask layer 310 will be sufficient to provide masking properties during for the pull-back etch process.

The angle of the facets 324 formed from the pull-back etch depend on a variety of factors, such as etch duration, type of etch performed, composition of etchant, and the like. However, as shown in FIG. 3d, the angle of the facets 324 are approximately at 45 degrees. Consequently, the thickness of the silicon nitride layer 306 can be used to roughly gauge the increase in the dimension of the opening into which insulating material will be deposited to form the isolation region. As also illustrated in FIG. 3d, the pad oxide layer 304 may be partially etched by the pullback etch.

Figure 3E:
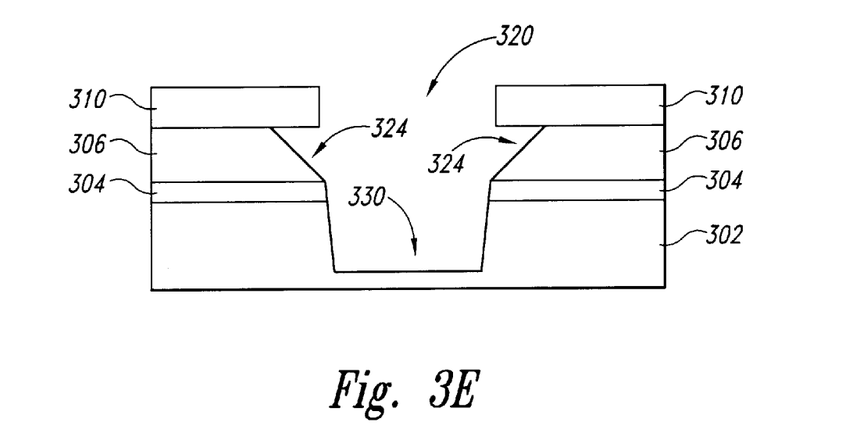
Figure 3F:
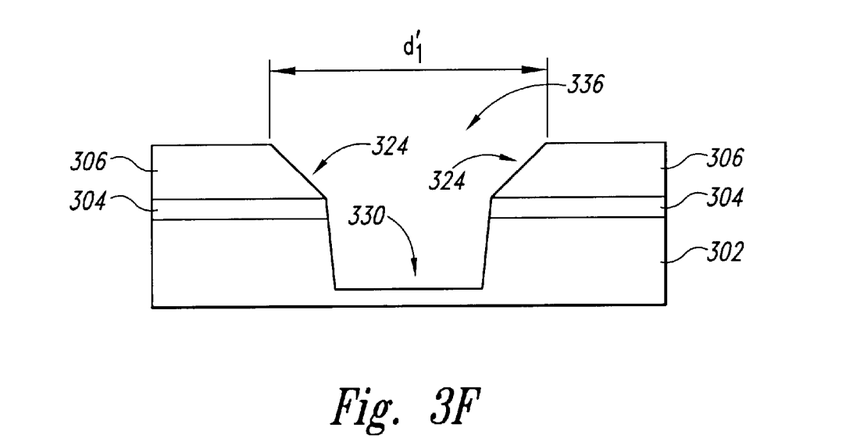
Figure 3G:
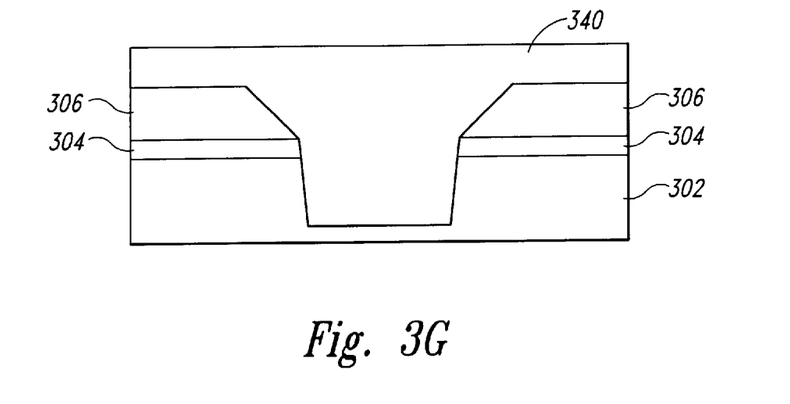

Following the formation of the facets 324, an etch process is performed to form a trench 330 through the opening 320 in the hard mask layer 310 (FIG. 3e). Typically, an anisotropic etch will be performed to form the trench 330. Those of ordinary skill in the art have sufficient understanding to adjust etch parameters to form a trench having the desired dimensions and sidewall profile. The hard mask layer 310 is subsequently removed to fully expose the trench 330 and faceted opening 336 in the silicon nitride layer 306 (FIG. 3f). It will be apparent that the dimension $d_1'$ of the faceted opening 336 is greater than the dimension $d_1$ of the opening 136 (FIG. 1) of the conventional process. As a result, deposition of a layer of insulating material 340, such as a silicon oxide material, into the trench 330 to form an isolation region is less likely to result in the formation of a void, which, as previously discussed with respect to the conventional process (FIG. 3g), is a concern.

Figure 3H:
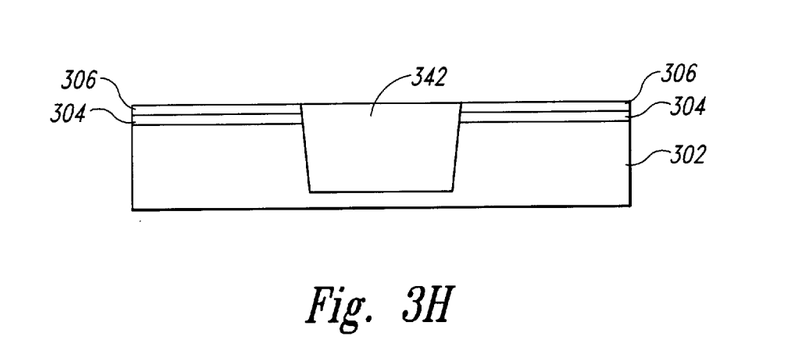

The layer of insulating material 340 and the silicon nitride layer 306 are etched back (FIG. 3h) to remove portions of the materials. A conventional chemical-mechanical polishing (CMP) process can be used to etch back the layer of insulating material 340 and the silicon nitride layer 306. As illustrated in FIG. 3h, a portion of the silicon nitride layer 306 remains over the pad oxide layer 304. It will be appreciated that the thickness of any remaining portion of the silicon nitride layer 306 may vary without departing from the scope of the present invention. It will be further appreciated that the etch back of the silicon nitride layer 306 may also continue until the entire layer is removed. Following the etch back process, a conventional etch process can be used to remove any residual silicon nitride. The pad oxide layer 304 is also removed, leaving an isolation region 342 formed in the substrate 302 (FIG. 3i).

Figure 3I:
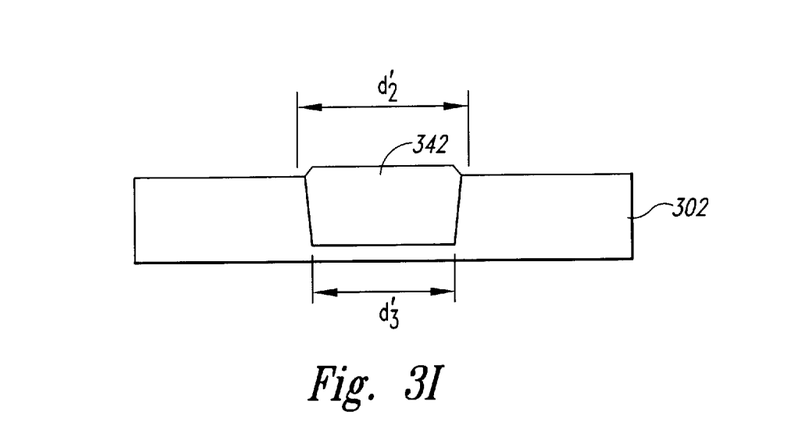

As illustrated in FIG. 3i, the dimensions $d_2'$ and $d_3'$ of the isolation region 342 may be substantially equal to the dimensions $d_2$ and $d_3$, respectively, of the isolation region 142 (FIG. 1) formed through the conventional process previously discussed. Thus, although embodiments of the present invention provide a structure and process less susceptible to the formation of voids when forming material within a trench, the dimension of any active regions adjacent to the isolation region can still be maintained.

As previously mentioned, embodiments of the present invention provide the advantage of being easily integrated into current process flows because existing photomasks can be used. Moreover, because the facets 324 are formed through an isotropic etch process, no additional masking steps need to be added to existing processes.

It will be appreciated that additional process steps can be included in embodiments of the present invention without departing from the scope of the present invention. For example, with respect to the previous example of forming a trench-type isolation region, implant steps may be performed following the formation of the trench 330 and prior to the formation of the layer of insulating material 340 to provide further channel stop capabilities.

Although the previous embodiment of the present invention was directed to the formation of an isolation region, it will be appreciated that some or all of the principles of the present invention can be used generally for the formation of a trench and the subsequent deposition of material therein. For example, embodiments of the present invention can be applied in the formation of a trench capacitor, or alternatively, in the formation of conductive interconnects. It will be further appreciated that embodiments of the present invention can also be used in the formation of contact holes or vias, and the subsequent deposition of a conductive material therein. Generally, some or all of the principles of the present invention can be applied where the dimensions of an opening are such that step coverage of a material deposited into the opening may result in the formation of voids.

Figure 4:
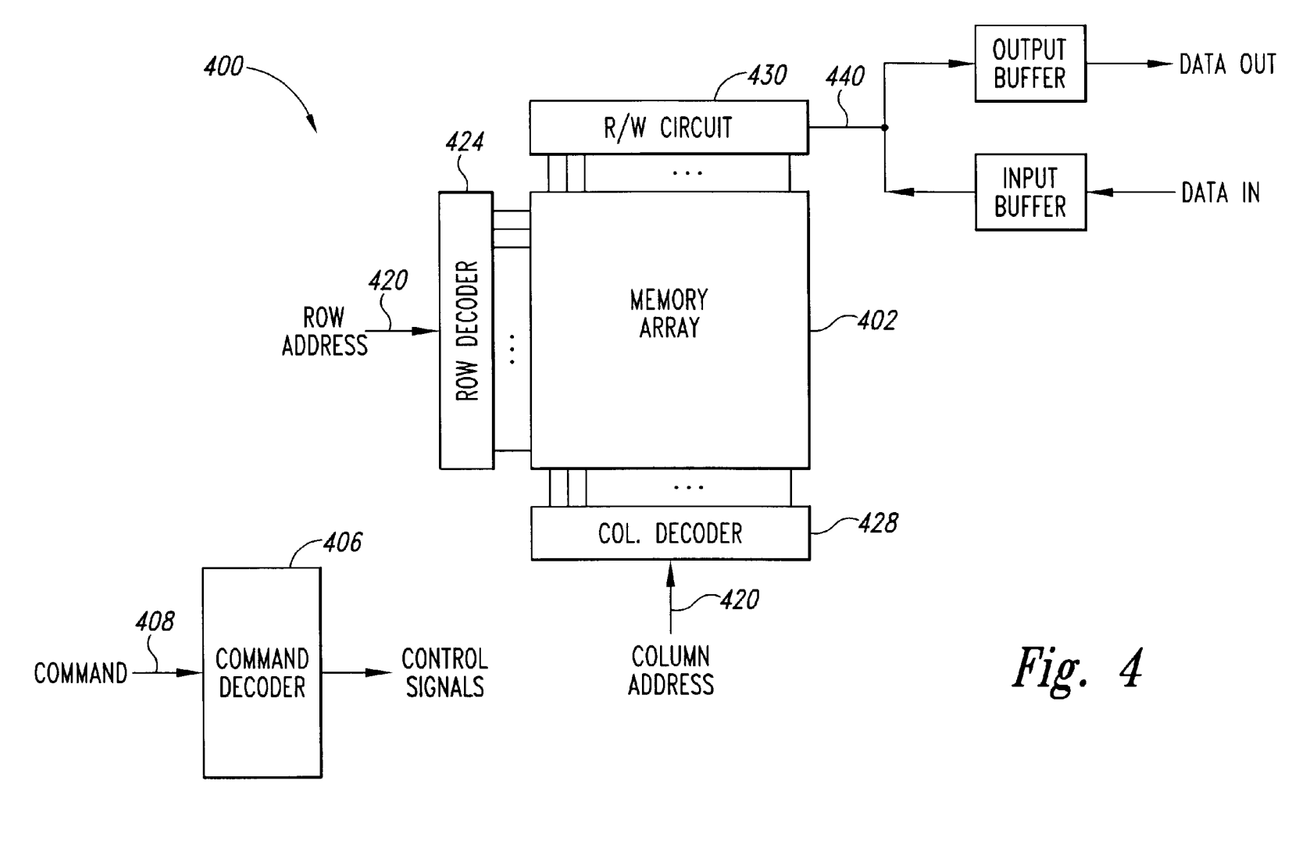
FIG. 4 is a block diagram of a memory device including an isolation region according to an embodiment of the present invention.

A memory device 400 that includes isolation regions according to an embodiment of the invention is shown in FIG. 4. The isolation regions are present in a memory array 402. The memory device 400 includes a command decoder 406 that receives memory command through a command bus 408 and generates corresponding control signals. A row or column address is applied to the memory device 400 through an address bus 420 and is decoded by a row address decoder 424 or a column address decoder 428, respectively. Memory array read/write circuitry 430 are coupled to the array 402 to provide read data to a data output buffer 434 via a input-output data bus 440. Write data are applied to the memory array through a data input buffer 444 and the memory array read/write circuitry 430.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for forming a structure from a semiconductor structure having a first layer of a silicon oxide material formed on a second layer of a silicon nitride material, the second layer having a first side proximate to the first layer and a second side proximate to a substrate, the method comprising:

forming a pad layer disposed between the second layer of silicon nitride and the substrate;

selectively etching the first layer of silicon oxide material to form a first opening therein, the first opening having a first dimension and exposing a portion of the second layer of silicon nitride material;

selectively etching the second layer of silicon nitride material through the first opening to form a second opening therethrough exposing the pad layer, the second opening having a first dimension on the first side and a second dimension on the second side, the first dimension of the second opening greater than the second dimension of the second opening and greater than the first dimension of the first opening; and selectively etching the pad layer and the substrate through the first and second openings to form a trench in the substrate.

2. The method of claim 1, further comprising:

removing the first layer;

forming a layer of insulating material over the second layer and within the trench;

removing a portion of the layer of insulating material over the second layer and a portion of the second layer; and removing any remaining portions of the second layer.

3. The method of claim 1, further comprising:

removing the first layer;

forming a layer of conductive material over the second layer and within the trench; and removing a portion of the layer of conductive material over the second layer and a portion of the second layer.

4. The method of claim 1 wherein selectively etching the second layer comprises isotropically etching the second layer.

5. A method for forming an isolation region from semiconductor structure having a substrate and a first layer of a silicon nitride material formed thereover, the first layer of silicon nitride having a first side proximate to the substrate and a second side opposite the first side, the method comprising:

forming a pad layer disposed between the first layer of silicon nitride and the substrate;

forming a hard mask layer over the second side of the first layer of silicon nitride, the hard mask layer having a first opening exposing the first layer;

undercutting the first layer of silicon nitride beneath the first opening in the hard mask layer to form a faceted opening through the first layer exposing the pad layer;

selectively etching the pad layer and the substrate through the faceted opening in the first layer of silicon nitride to form a trench in the substrate;

removing the hard mask layer;

forming a layer of insulating material over the first layer of silicon nitride and in the trench; and removing the layer of insulating material over the first layer of silicon nitride and removing the first layer.

6. The method of claim 5 wherein undercutting the first layer beneath the first opening comprises isotropically etching the first layer.

7. A The method of claim 5 wherein forming a hard mask layer having a first opening comprises:

forming a layer of a silicon oxide material over the second side of the first layer; and selectively etching through the layer of silicon oxide material to form the first opening.

8. The method of claim 5 wherein removing the layer of insulating material over the first layer comprises etching the layer of insulating material with a chemical-mechanical etching process.

9. A method for filling a trench formed in semiconductor substrate, comprising:

forming a pad layer over the substrate;

forming a first layer of silicon nitride over the substrate and the pad layer having a first side proximate to the substrate and a second side opposite of the first side;

forming a hard mask layer over the second side of the first layer of silicon nitride, the hard mask layer having an opening therethrough;

selectively overetching an opening through the first layer of silicon nitride to form faceted surfaces underlying the opening through the hard mask layer to expose the pad layer;

etching the pad layer and further etching a trench in the substrate through the overetched opening in the first layer of silicon nitride;

removing the hard mask layer; and forming a layer over the first layer of silicon nitride and within the trench.

10. The method of claim 9 wherein selectively overetching through the first layer to form faceted surfaces comprises isotropically etching the first layer.

11. The method of claim 9 wherein forming the layer over the first layer and within the trench comprises forming a layer from an insulating material.

12. The method of claim 11, further comprising:

removing the layer of insulating material over the first layer; and removing the first layer.

13. The method of claim 9 wherein forming the layer over the first layer and within the trench comprises forming a layer from a conductive material.

14. The method of claim 13, further comprising:

forming a dielectric layer over the layer of conductive material; and forming a second layer from a conductive material over the dielectric layer to form a capacitor plate.

15. A method for forming a semiconductor structure on a substrate, comprising:

forming a pad layer over the substrate;

forming a first layer of a silicon nitride material over the pad layer;

forming a faceted opening through the first layer of silicon nitride material to expose the pad layer; and etching trough the pad layer and further etching a trench in the substrate through the faceted opening.

16. The method of claim 15 wherein the silicon nitride material and the material of the substrate can be selectively etched with respect to one another.

17. The method of claim 15 wherein forming a faceted opening through the first layer comprises:

forming a mask layer over the first layer;

exposing a portion of the first layer through an opening in the mask layer;

selectively etching the first layer through the opening in the mask layer.

18. The method of claim 17 wherein selectively etching the first layer comprises isotropically etching the first layer.

19. A method for forming a semiconductor structure on a substrate, comprising:

forming a pad layer over the substrate;

forming a first layer of a silicon nitride material over the pad layer, the silicon nitride material and the material from which the substrate is formed can be selectively etched with respect to one another;

forming a faceted opening through the first layer of silicon nitride material to expose the pad layer; and etching through the pad layer and further etching a trench in the substrate through the faceting opening.

20. The method of claim 19 wherein forming a faceted opening through the first layer comprises:

forming a mask layer over the first layer;

exposing a portion of the first layer through an opening in the mask layer;

selectively etching the first layer through the opening in the mask layer.

21. The method of claim 20 wherein selectively etching the first layer through the opening comprises isotropically etching the first layer.

* * * * *